US008747164B2

(12) United States Patent
Westman et al.

(10) Patent No.: US 8,747,164 B2
(45) Date of Patent: Jun. 10, 2014

(54) CARD EDGE CONNECTOR

(75) Inventors: John Eugene Westman, Harrisburg, PA (US); Brian Keith McMaster, Jr., Mechanicsburg, PA (US); Michael Frank Cina, Elizabethtown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 76 days.

(21) Appl. No.: 13/038,170

(22) Filed: Mar. 1, 2011

(65) Prior Publication Data

US 2012/0225588 A1   Sep. 6, 2012

(51) Int. Cl.
*H01R 24/00* (2011.01)
*H01R 12/91* (2011.01)
*H05K 1/11* (2006.01)
*H01R 12/72* (2011.01)

(52) U.S. Cl.
CPC ...... *H01R 12/721* (2013.01); *H05K 2201/0919* (2013.01); *H05K 2201/10189* (2013.01); *H01R 12/91* (2013.01); *H05K 1/117* (2013.01)
USPC ............................................ 439/637; 439/60

(58) Field of Classification Search
USPC ............ 439/101, 108, 629, 636, 637, 607.05, 439/607.13, 607.14, 60
See application file for complete search history.

(56) References Cited

U.S. PATENT DOCUMENTS

| | | | | |
|---|---|---|---|---|
| 5,026,292 | A * | 6/1991 | Pickles et al. | 439/108 |
| 5,051,099 | A * | 9/1991 | Pickles et al. | 439/108 |
| 6,015,299 | A * | 1/2000 | Walse et al. | 439/60 |
| 6,129,555 | A * | 10/2000 | Daikuhara et al. | 439/60 |
| 6,350,134 | B1 | 2/2002 | Fogg et al. | |
| 6,464,537 | B1 * | 10/2002 | Letourneau et al. | 439/607.14 |
| 6,540,559 | B1 | 4/2003 | Kemmick et al. | |
| 6,767,252 | B2 * | 7/2004 | McGrath et al. | 439/637 |
| 6,805,586 | B2 * | 10/2004 | Akama et al. | 439/607.07 |
| 6,981,898 | B2 * | 1/2006 | Akama et al. | 439/607.09 |

(Continued)

FOREIGN PATENT DOCUMENTS

EP          0881718 A2    12/1998
WO     2007127118 A1    11/2007

OTHER PUBLICATIONS

International Search Report, International Application No. PCT/US2012/000096, International Filing Date Feb. 21, 2012.

*Primary Examiner* — Thanh Tam Le

(57) ABSTRACT

A card edge connector is provided for mating with a printed circuit board (PCB) having a card edge. The connector includes a housing having a card slot. The card slot is configured to receive the card edge of the PCB therein. The card slot includes opposing first and second sides. Signal contacts are held by the housing. The signal contacts include signal mating segments arranged in opposing first and second rows that extend along the opposing first and second sides, respectively, of the card slot. The signal mating segments are arranged in differential signal pairs, wherein the signal mating segments within a differential pair are arranged within the same row of the first and second rows. A ground contact is held by the housing. The ground contact includes a base and first and second ground mating segments that extend outwardly from the base. The first and second ground mating segments are arranged along the first and second sides, respectively, of the card slot such that the first and second ground mating segments are configured to engage the card edge therebetween. The first and second ground mating segments include springs that resiliently deflect when engaged by the card edge.

16 Claims, 11 Drawing Sheets

(56) References Cited

U.S. PATENT DOCUMENTS

| | | |
|---|---|---|
| 7,410,392 B2 | 8/2008 | Szczesny et al. |
| 7,604,510 B2 * | 10/2009 | Akama et al. ............... 439/637 |
| 7,674,133 B2 | 3/2010 | Fogg et al. |
| 7,775,839 B1 * | 8/2010 | Okuyama et al. .......... 439/733.1 |
| 7,824,224 B2 * | 11/2010 | Su et al. ...................... 439/629 |
| 8,083,526 B2 * | 12/2011 | Long .............................. 439/60 |
| 8,231,411 B1 * | 7/2012 | Westman et al. ........ 439/607.05 |

\* cited by examiner

CARD EDGE CONNECTOR

BACKGROUND OF THE INVENTION

The subject matter described and/or illustrated herein relates generally to card edge connectors.

Computers and servers use numerous types of electronic modules, such as processor and memory modules (e.g. Dynamic Random Access Memory (DRAM), Synchronous Dynamic Random Access Memory (SDRAM), or Extended Data Out Random Access Memory (EDO RAM), and the like). The memory modules are produced in a number of formats such as, for example, Single In-line Memory Modules (SIMM's), Dual In-line Memory Modules (DIMM's), Small Outline DIMM's (SODIMM's), Fully Buffered DIMM's, and the like. The electronic modules may be installed in card edge connectors that are mounted on a motherboard or other system board.

Electronic modules often include a printed circuit board (PCB) having a card edge that is received within a card slot of the card edge connector. The PCB includes contact pads arranged along the card edge on two opposite sides of the PCB. The card edge connector includes a pair of opposite rows of electrical contacts extending within the card slot. When the card edge of the PCB is received within the card slot, the electrical contacts of each row of the card edge connector engage the contact pads on a corresponding one of the sides of the PCB. The electrical contacts and the contact pads are typically arranged in differential signal pairs. Ground contacts and ground contact pads are sometimes positioned between adjacent differential pairs within the rows of electrical contacts and contact pads, respectively. The ground contacts and contact pads facilitate decreasing crosstalk between adjacent differential signal pairs. But, the proximity of the ground contacts and ground contact pads to the differential pairs may reduce the impedance of signals transmitted through the differential pairs, which may reduce the efficiency of data transfer through the card edge connector.

BRIEF DESCRIPTION OF THE INVENTION

In one embodiment, a card edge connector is provided for mating with a printed circuit board (PCB) having a card edge. The connector includes a housing having a card slot. The card slot is configured to receive the card edge of the PCB therein. The card slot includes opposing first and second sides. Signal contacts are held by the housing. The signal contacts include signal mating segments arranged in opposing first and second rows that extend along the opposing first and second sides, respectively, of the card slot. The signal mating segments are arranged in differential signal pairs, wherein the signal mating segments within a differential pair are arranged within the same row of the first and second rows. A ground contact is held by the housing. The ground contact includes a base and first and second ground mating segments that extend outwardly from the base. The first and second ground mating segments are arranged along the first and second sides, respectively, of the card slot such that the first and second ground mating segments are configured to engage the card edge therebetween. The first and second ground mating segments include springs that resiliently deflect when engaged by the card edge.

In another embodiment, an electrical connector assembly includes a printed circuit board (PCB) having a card edge and a ground plane that extends along the card edge. The assembly also includes a card edge connector including a housing having a card slot. The card slot receives the card edge of the PCB therein. The card slot includes opposing first and second sides. Signal contacts are held by the housing. The signal contacts include mating segments arranged in opposing first and second rows that extend along the opposing first and second sides, respectively, of the card slot. The card edge is received within the card slot such that the ground plane extends between the opposing first and second rows of the mating segments.

DETAILED DESCRIPTION OF THE INVENTION

Figure 1:
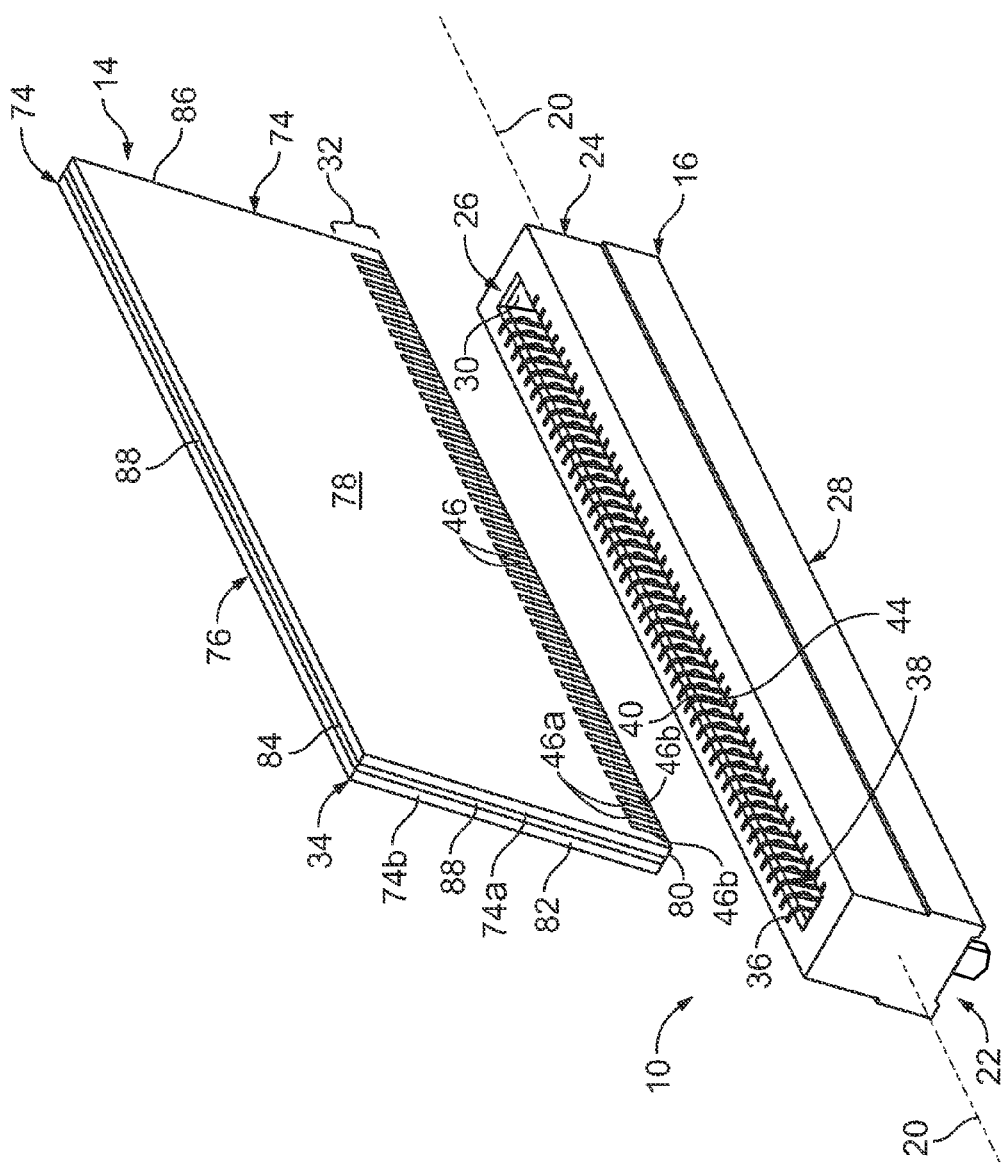
FIG. 1 is a partially exploded perspective view of an exemplary embodiment of a card edge connector and a portion of an exemplary embodiment of an electronic module.

FIG. 1 is a partially exploded perspective view of an exemplary embodiment of a card edge connector 10 and a portion of an exemplary embodiment of an electronic module 14. The connector 10 includes a dielectric housing 16 that extends a length along a central longitudinal axis 20 from an end 22 to an opposite end 24. The housing 16 has a mating side 26 and a mounting side 28. The housing 16 includes a card slot 30 that is configured to receive a card edge 32 of the electronic module 14 therein. More specifically, the electronic module 14 includes a printed circuit board (PCB) 34 that includes the card edge 32. Only the PCB 34 of the electronic module 14 is shown in FIG. 1. As used herein, the term "printed circuit board" is intended to mean any electric circuit in which the electrical conductors have been printed or otherwise deposited in predetermined patterns on an electrically insulating substrate. A combination of the connector 10 and the electronic module 14 may be referred to herein as an "electrical connector assembly".

The housing 16 includes a plurality of openings 36 that each fluidly communicate with the card slot 30 and extend through the housing 16 from the mating side 26 to the mounting side 28. Each opening 36 holds at least a portion of one or more electrical contacts 38 therein. The electrical contacts 38 include mating segments 40 and mounting segments 42 (FIG.

3). The mating segments 40 extend into the card slot 30 and include mating interfaces 44 that engage corresponding contact pads 46 on the card edge 32 of the electronic module 14 when the electronic module 14 is mated with the connector 10. The mounting segments 42 extend along the mounting side 28 of the housing 16 and are configured to electrically connect the connector 10 to a motherboard (not shown). When the electronic module 14 is mated with the connector 10, the connector 10 electrically connects the electronic module 14 to the motherboard. The connector 10 may include any number of the electrical contacts 38.

Figure 2:
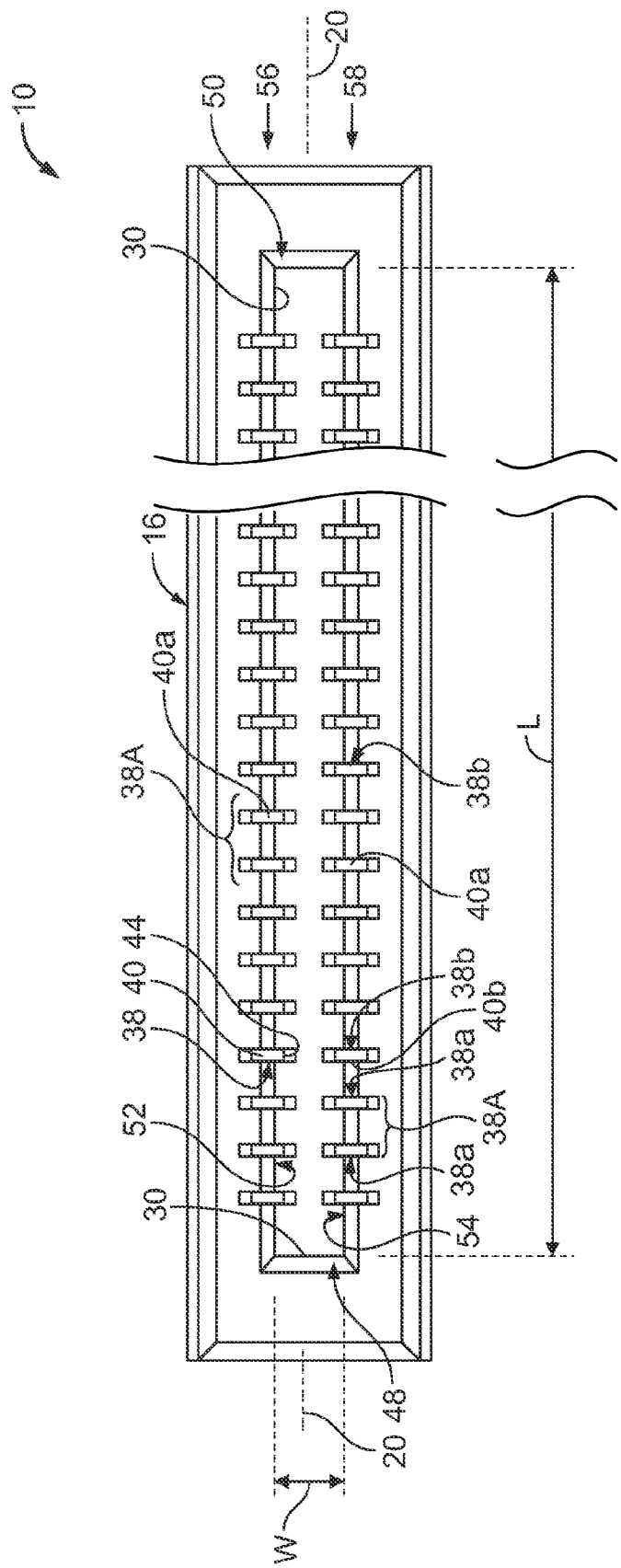
FIG. 2 is a top plan view of the card edge connector shown in FIG. 1.

FIG. 2 is a top plan view of the card edge connector 10. The card slot 30 extends a length L along the central longitudinal axis 20 from an end 48 to an opposite end 50. The card slot 30 extends a width W from a side 52 to an opposite side 54. The card slot 30 is elongate such that the length L of the card slot 30 is greater than the width W of the card slot 30. The mating segments 40 of the electrical contacts 38 are arranged in a pair of opposing rows 56 and 58 that extend along the sides 52 and 54, respectively, of the card slot 30. In other words, each of the rows 56 and 58 extends along the length L of the card slot 30 on a respective one of the sides 52 and 54. More particularly, the rows 56 and 58 extend in directions that extend along the direction of the length L of the card slot 30. The mating interfaces 44 of the electrical contacts 38 within the row 56 face generally towards, or oppose, the mating interfaces 44 of the electrical contacts 38 within the opposing row 58, and vice versa. The length L of the card slot 30 may be referred to herein as a "slot length". Each of the sides 52 and 54 of the card slot 30 may be referred to herein as a "first side" and/or a "second side". The rows 56 and 58 may each be referred to herein as a "first row" and/or a "second row".

The electrical contacts 38 include signal contacts 38a and ground contacts 38b. Optionally, the electrical contacts 38 include one or more power contacts that are configured to carry electrical power. The signal contacts 38a are arranged in differential signal pairs 38A. In the exemplary embodiment, mating segments 40a of adjacent signal contacts 38a within the row 56 are arranged in differential signal pairs 38A, and mating segments 40a of adjacent signal contacts 38a within the row 58 are arranged in differential signal pairs 38A. In some alternative embodiments, one or more of the signal contacts 38a is not arranged in a differential signal pair. Moreover, in some alternative embodiments, the mating segment 40a of a signal contact 38a within the row 56 is arranged in a differential signal pair with the mating segment 40a of a signal contact 38a within the row 58. In the exemplary embodiment, along the length of the housing 16 (i.e., along the central longitudinal axis 20), the mating segments 40a of the differential signal pairs 38A within the row 56 are aligned with the mating segments 40a of corresponding differential signal pairs 38A within the row 58. Alternatively, the mating segments 40a of differential pairs 38A within the rows 56 and 58 are alternatively staggered relative to each other along the length of the housing 16 (e.g., the mating segments 140a of the differential pairs 138A of the card edge connector 110 shown in FIGS. 7-9).

Each of the mating segments 40a of the signal contacts 38a may be referred to herein as a "signal mating segment". The signal contacts 38a having mating segments 40a arranged within the row 56 may be referred to herein as "first signal contacts" and/or "second signal contacts", while the signal contacts 38a having mating segments 40a arranged within the row 58 may be referred to herein as "first signal contacts" and/or "second signal contacts". The differential signal pairs 38A of the signal contacts 38a within the row 56 and the differential signal pairs 38A of the signal contacts 38a within the row 58 may be referred to herein as "first differential signal pairs" and/or "second differential signal pairs".

Mating segments 40b of the ground contacts 38b are arranged within the rows 56 and 58 between adjacent differential signal pairs 38A. In the exemplary embodiment, a single mating segment 40b of the ground contacts 38b extends between each pair of adjacent differential signal pairs 38A within each of the rows 56 and 58. But, any number of mating segments 40b of the ground contacts 38b may extend between adjacent differential signal pairs 38A. Each of the mating segments 40b of the ground contacts 38b may be referred to herein as a "ground mating segment".

Figure 3:
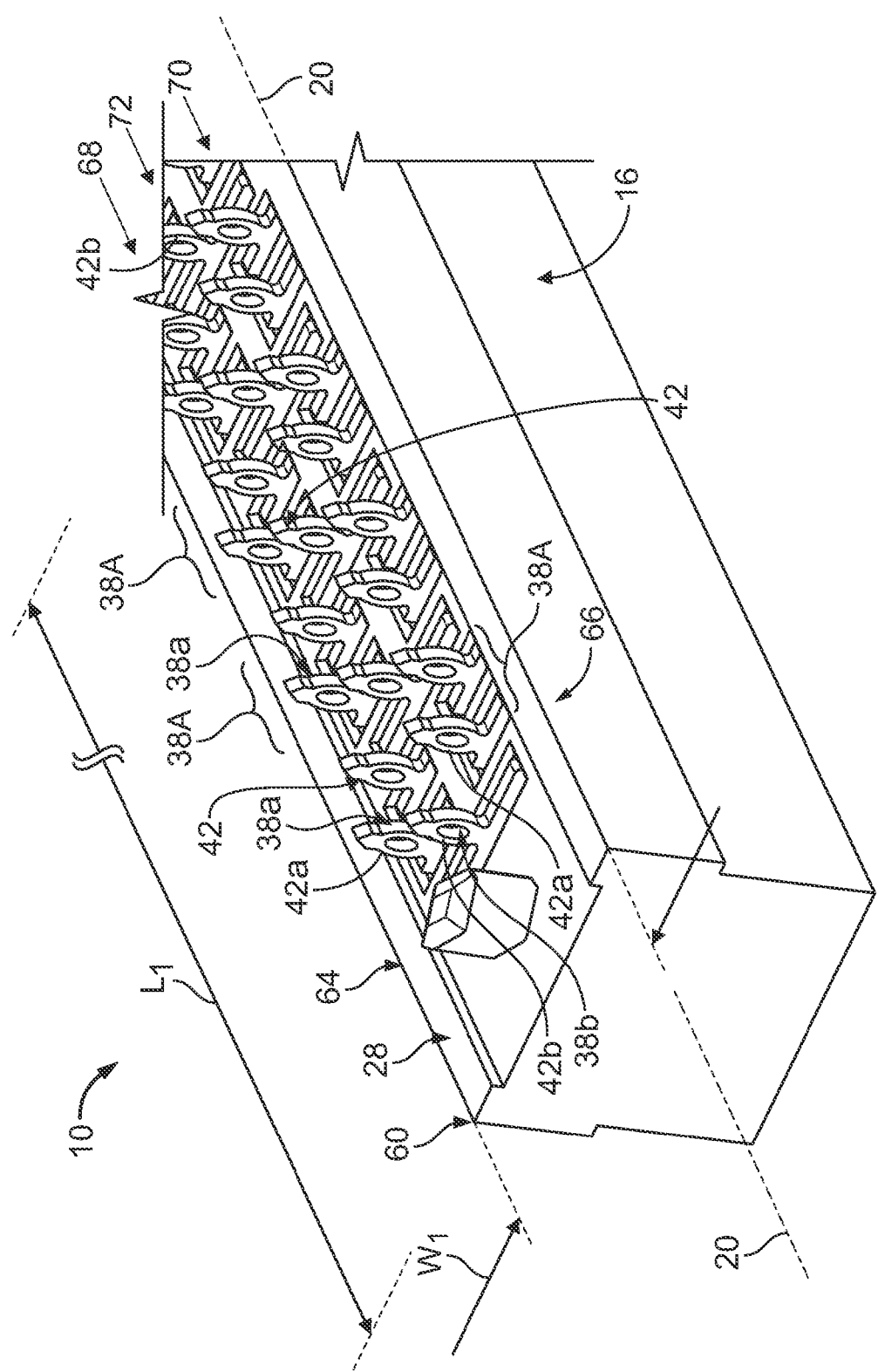
FIG. 3 is a perspective view of a portion of the card edge connector shown in FIG. 1.

FIG. 3 is a perspective view of a portion of the card edge connector 10 illustrating the mounting side 28 of the housing 16. The mounting side 28 extends a length $L_1$ along the central longitudinal axis 20 from an end 60 to an opposite end (not shown). Only a portion of the length $L_1$ of the mounting side 28 is shown in FIG. 3. The mounting side 28 extends a width $W_1$ from a side 64 to an opposite side 66. The length $L_1$ of the mounting side 28 extends in a direction that extends along the direction of the length L of the card slot 30. For example, in the exemplary embodiment the length $L_1$ of the mounting side 28 extends in a direction that is approximately parallel to the direction of the length L of the card slot 30. The length $L_1$ of the mounting side 28 may be referred to herein as a "side length".

Mounting segments 42a of the signal contacts 38a are arranged in a pair of rows 68 and 70 that extend along the length $L_1$ of the mounting side 28. More particularly, the rows 68 and 70 extend in directions that extend along the direction of the length $L_1$ of the mounting side 28. The rows 68 and 70 are spaced apart from each other along the width $W_1$ of the mounting side 28. As described above, the signal contacts 38a are arranged in the differential signal pairs 38A. Specifically, the mounting segments 42a of adjacent signal contacts 38a within the row 68 are arranged in the differential signal pairs 38A, and the mounting segments 42a of adjacent signal contacts 38a within the row 70 are arranged in the differential signal pairs 38A. In some alternative embodiments, the mounting segment 42a of a signal contact 38a within the row 68 is arranged in a differential signal pair with the mounting segment 42a of a signal contact 38a within the row 70. In the exemplary embodiment, the mounting segments 42a of differential pairs 38A within the rows 68 and 70 are transversely aligned with each other along the length $L_1$ of the mounting side 28 (i.e., along the central longitudinal axis 20). Alternatively, the mounting segments 42a of differential pairs 38A within the rows 68 and 70 are staggered with respect to each other along the length $L_1$ of the mounting side 28 (e.g., the mounting segments 142a of the differential pairs 138A of the card edge connector 110 shown in FIGS. 7-9). The mounting segments 42a arranged within the row 68 may be referred to herein as "first signal mounting segments" and/or "second signal mounting segments", while the mounting segments 42a arranged within the row 70 may be referred to herein as "first signal mounting segments" and/or "second signal mounting segments". The rows 68 and 70 may each be referred to herein as a "first signal row" and/or a "second signal row".

Mounting segments 42b of the ground contacts 38b are arranged in a row 72 that extends along the length $L_1$ of the of the mounting side 28 of the housing 16. More particularly, the row 72 extends in a direction that extends along the direction of the length $L_1$ of the of the mounting side 28. The row 72 extends between the rows 68 and 70 along the width $W_1$ of the mounting side 28 of the housing 16. Along the length $L_1$ of the mounting side 28, the mounting segments 42b of the ground contacts 38b extend between adjacent differential signal pairs 38A within the row 68 and between adjacent differential pairs 38A within the row 70. Although only a single mounting segment 42b of the ground contacts 38b extends between adjacent differential signal pairs 38A within each of the rows 68 and 70 along the length $L_1$ of the mounting side 28, any number of mounting segments 42b of the ground contacts 38b may extend between adjacent differential signal pairs 38A within each of the rows 68 and 70 along the length $L_1$ of the mounting side 28. Each of the mounting segments 42b of the ground contacts 38b may be referred to herein as a "ground mounting segment", while the row 72 may be referred to herein as a "ground row".

Referring again to FIG. 1, the PCB 34 of the electronic module 14 includes a substrate 74. The substrate 74 includes a pair of opposite sides 76 and 78. The PCB 34 includes edge surfaces 80, 82, 84, and 86, which intersect the sides 76 and 78. The card edge 32 of the PCB 34 is defined by the edge surface 80, portions of the sides 76 and 78 that are proximate the edge surface 80, and portions of the edge surfaces 82 and 84 that are proximate the edge surface 80. As described above, the PCB 34 includes contact pads 46 arranged along the card edge 32. Specifically, on each of the sides 76 and 78 of the substrate 74, the card edge 32 includes a plurality of signal contact pads 46a and a plurality of ground contact pads 46b. Electrical traces (not shown) and/or other electrical conductors (not shown) electrically connect each of the signal contact pads 46a to one or more electronic components (not shown) of the electronic module 14. Similarly, electrical traces (not shown) and/or other electrical conductors (not shown) electrically connect each of the ground contact pads 46b to one or more grounds of the electronic module 14. For example, in the exemplary embodiment the PCB 34 includes a ground plane 88 and the electrical traces and/or other electrical conductors electrically connect the ground contact pads 46b to the ground plane 88. The PCB 34 may include any number of the contact pads 46. Each of the ground contact pads 46b on the side 76 and each of the ground contact pads 46b on the side 78 may be referred to herein as a "first ground contact pad" and a "second ground contact pad". Each of the sides 76 and 78 of the substrate 74 may be referred to herein as a "first side" and/or a "second side" of the card edge 32.

As can be seen in FIG. 1, the ground plane 88 extends along the card edge 32 of the PCB 34. The ground plane 88 is a layer of the PCB 34 that appears as an infinite ground potential to at least some of the signals being transmitted by the signal contacts 38a. In the exemplary embodiment, the ground plane 88 is an internal layer of the PCB 34. In other words, the ground plane optionally extends within the substrate 74 of the PCB 34 at a location between the sides 76 and 78 and thereby within a thickness of the substrate 74 that is defined from the side 76 to the side 78. In the exemplary embodiment, the ground plane 88 is an internal layer of the PCB 34 that divides the substrate 74 into two layers 74a and 74b. The ground plane 88 is sandwiched between the layers 74a and 74b of the substrate 74. Alternatively, the ground plane 88 is an exterior layer of the PCB 34 that extends on the side 76 and/or the side 78 of the substrate 74.

The ground plane 88 optionally extends to the edge surfaces 80, 82, 84, and/or 86, such that the ground plane 88 defines a portion of the edge surfaces 80, 82, 84, and/or 86 (the remainder being defined by the substrate 74). In the exemplary embodiment, the ground plane 88 extends to each of the edge surfaces 80, 82, 84, and 86 and extends continuously therebetween. The ground plane 88 thereby extends continuously between the substrate layers 74a and 74b from the edge surface 80 to the edge surface 84 and from the edge surface 82 to the edge surface 86. Alternatively, the ground plane 88 does not extend continuously from the edge surface 80 to the edge surface 84 and from the edge surface 82 to the edge surface 86.

The ground plane 88 extends along a larger area of the PCB 34 than each of the contact pads 46 and each of any electrical traces of the PCB 34. The contact pads 46 and any electrical traces of the PCB 34 are not ground planes. In some alternative embodiments, the PCB 34 includes more than one ground plane 88, wherein some or all of the ground planes 88 may or may not be electrically connected together. The PCB 34 may include any number of the ground planes 88, wherein each ground plane 88 may be an interior and/or exterior layer of the PCB 34.

Figure 4:
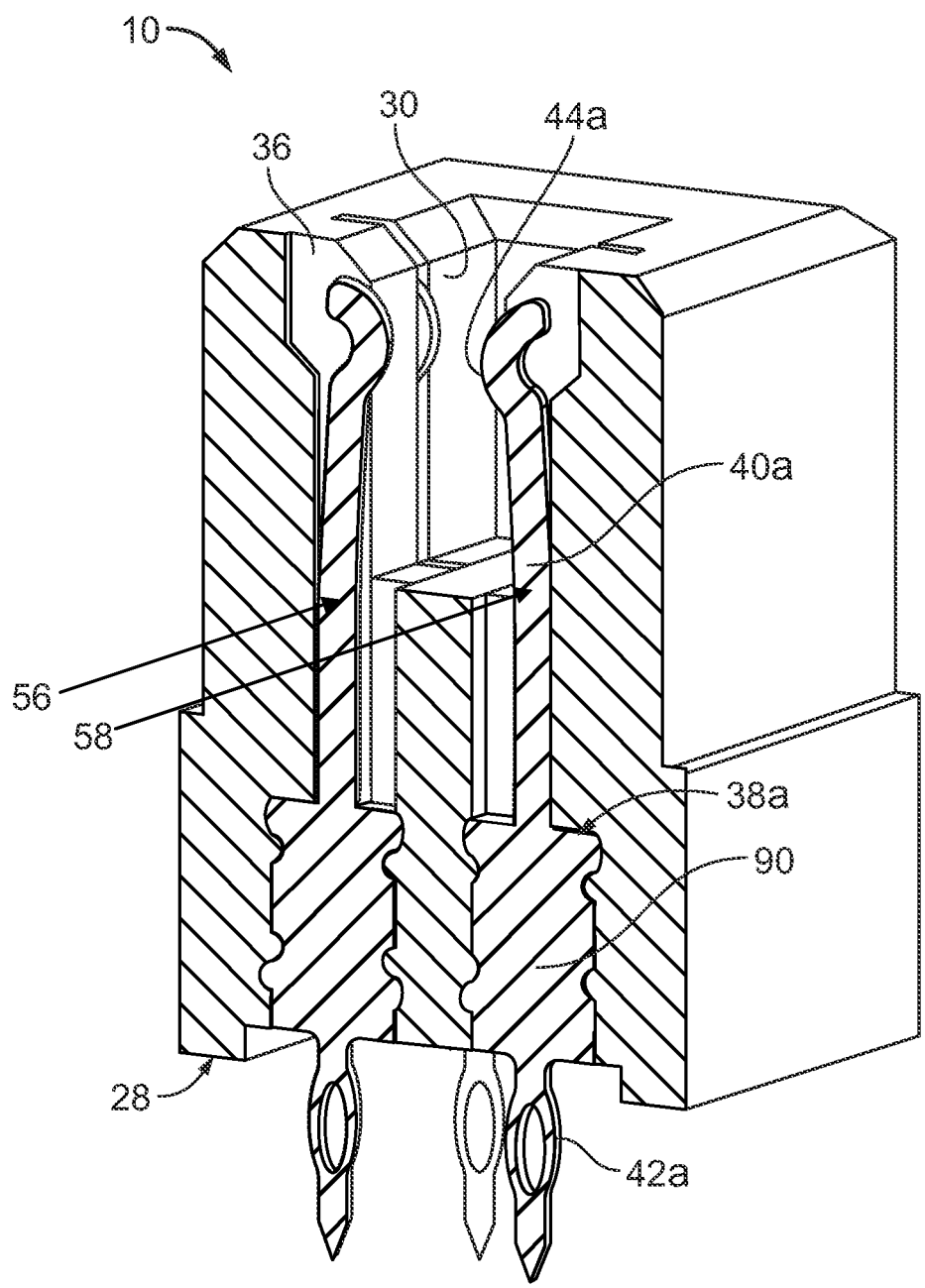
FIG. 4 is a perspective view of a cross section of the card edge connector shown in FIG. 1 illustrating an exemplary embodiment of a signal contact of the card edge connector.
Figure 6:
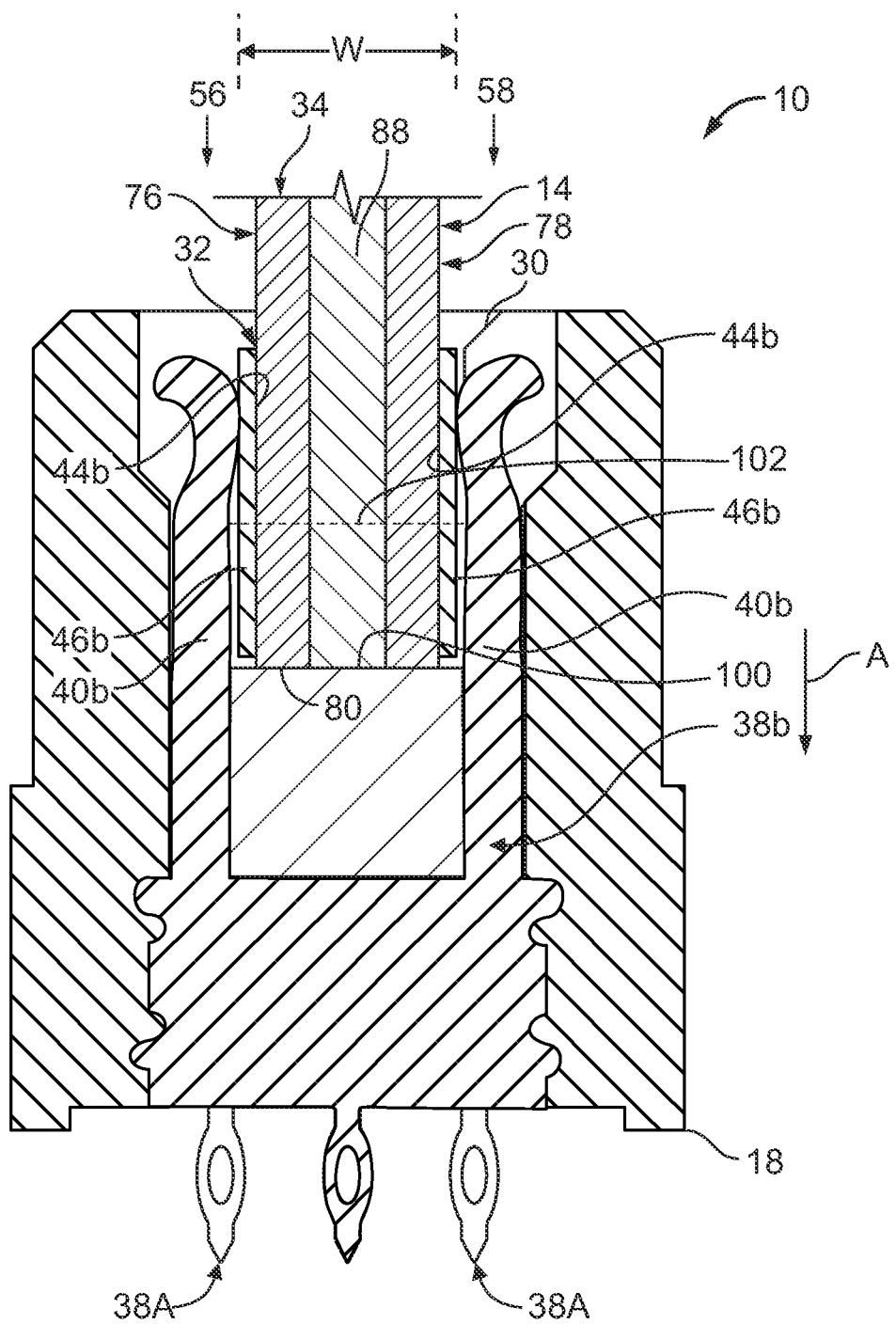
FIG. 6 is a cross-sectional view of the card edge connector shown in FIG. 1 illustrating the electronic module shown in FIG. 1 mated therewith.

FIG. 4 is a perspective view of a cross section of the card edge connector 10 illustrating an exemplary embodiment of a signal contact 38a. The signal contacts 38a include the mating segments 40a, the mounting segments 42a, and bases 90 that extend from the mating segments 40a to the mounting segments 42a. The signal contacts 38a are held by the housing 16 within the corresponding opening 36 such that the mating segments 40a extend into the card slot 30. More specifically, mating interfaces 44a of the mating segments 40a extend into the card slot 30. The mating interfaces 44a of the mating segments 40a that are arranged in the row 56 engage corresponding contact pads 46a (FIG. 1) on the side 76 (FIGS. 1 and 6) of the PCB 34 (FIGS. 1 and 6) of the electronic module 14 (FIGS. 1 and 6). The mating interfaces 44a of the mating segments 40a that are arranged in the row 58 engage corresponding contact pads 46 on the side 78 (FIGS. 1 and 6) of the PCB 34. The mating segments 40a of the signal contacts 38a are springs that have a natural resting position shown in FIG. 4. The mating segments 40a resiliently deflect, against bias to the natural resting position, when engaged by the contact pads 46 of the electronic module 14. The bases 90 may be referred to herein as "signal bases".

The mounting segments 42a of the signal contacts 38a extend along the mounting side 28 of the housing 16 for electrical connection to the motherboard. In the exemplary embodiment, the mounting segments 42a include eye-of-the needle press-fit pins that are received within corresponding electrical vias (not shown) of the mother board. But, the mounting segment 42a of each signal contact 38a may have any other structure, geometry, and/or the like that enables the mounting segment 42a to electrically connect to the motherboard, such as, but not limited to, a solder tail, a surface mount structure, another type of press-fit pin, and/or the like.

Figure 5:
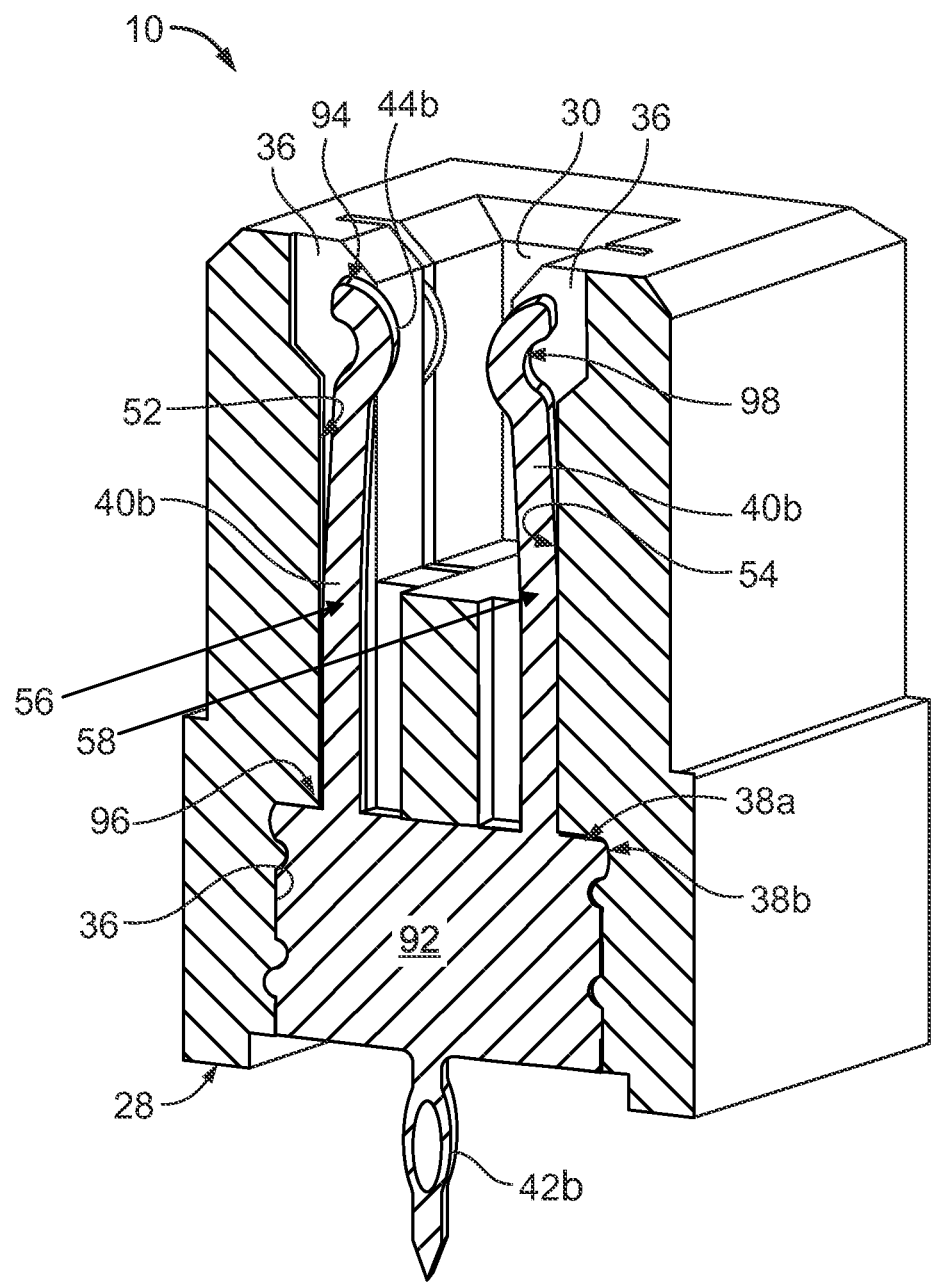
FIG. 5 is a perspective view of another cross section of the card edge connector shown in FIG. 1 illustrating an exemplary embodiment of a ground contact of the card edge connector.

FIG. 5 is a perspective view of another cross section of the card edge connector 10 illustrating an exemplary embodiment of a ground contact 38b. The ground contact 38b is held by the housing 16 within the corresponding opening 36. The ground contact 38b includes a base 92, one of the mounting segments 42b, and two of the mating segments 40b. The mating segments 40b extend outwardly from the base 92 such that the mating segments 40b, and more particularly the mating interfaces 44b thereof, extend into the card slot 30. As can be seen in FIG. 5, one of the mating segments 40b of the ground contact 38b is arranged within the row 56, while the other mating segment 40b of the ground contact 38b is arranged within the row 58. The mating interfaces 44b of the two mating segments 40b of the ground contact 38b oppose each other within the card slot 30 such that the two mating interfaces 44b are configured to engage the card edge 32 (FIGS. 1 and 6) of the PCB 34 (FIGS. 1 and 6) therebetween. The mating interface 44b of the mating segment 40b arranged in the row 56 engages a corresponding contact pad 46b (FIGS. 1 and 6) on the side 76 (FIGS. 1 and 6) of the PCB 34 (FIGS.

1 and 6) of the electronic module 14 (FIGS. 1 and 6). The mating interface 44b of the mating segment 40b that is arranged in the row 58 engages a corresponding contact pad 46 on the side 78 (FIGS. 1 and 6) of the PCB 34. Each of the mating segments 40b of the ground contact 38b may be referred to herein as a "first ground mating segment" and/or a "second ground mating segment". The base 92 may be referred to herein as a "ground base".

In the exemplary embodiment, the mating segments 40b of the ground contact 38b are elongate arms that extend a length from the base 92 to a tip end 94. Specifically, the mating segments 40b extend the length from the tip end 94 to a base end 96 that extends from the base 92. Optionally, the mating segments 40b include curved sub-segments 98. Each curved sub-segment 98 includes the corresponding mating interface 44b. For each mating segment 40b that is arranged within the row 56 (along the side 76 of the card slot), the curved sub-segment 98 offsets the mating interface 44b, relative to the base end 96, toward the side 54 of the card slot 30. For each mating segment 40b that is arranged within the row 58 (along the side 78 of the card slot), the curved sub-segment 98 offsets the mating interface 44b, relative to the base end 96, toward the side 52 of the card slot 30. The elongate arms of the mating segments 40b of the ground contacts 38b are springs that have a natural resting position shown in FIG. 5. The mating segments 40b resiliently deflect, against bias to the natural resting position, when engaged by the contact pads 46 of the electronic module 14.

The mounting segment 42b of each ground contact 38b extends along the mounting side 28 of the housing 16 for electrical connection to the motherboard. The exemplary embodiment of the mounting segments 42b is an eye-of-the needle press-fit pin that is received within a corresponding electrical via (not shown) of the mother board. But, the mounting segment 42b of one or more of the ground contacts 38b may have any other structure, geometry, and/or the like that enables the mounting segment 42b to electrically connect to the motherboard, such as, but not limited to, a solder tail, a surface mount structure, another type of press-fit pin, and/or the like.

FIG. 6 is a cross-sectional view of the card edge connector 10 illustrating the electronic module 14 mated therewith. When the electronic module 14 is mated with the connector 10, the card edge 32 of the PCB 34 of the electronic module 14 is received within the card slot 30 of the connector 10. The mating segments 40b of the ground contacts 38b engage the card edge 32 of the PCB 34 therebetween such that the ground contacts 38b are electrically connected to the ground plane 88. More specifically, the mating interfaces 44b of the mating segments 40b arranged within the row 56 are engaged with the ground contact pads 46b on the side 76 of the card edge 32 to electrically connect the mating segments 40b to the ground contact pads 46b, and thereby the ground plane 88. The mating interfaces 44b of the mating segments 40b arranged within the row 58 are engaged with the ground contact pads 46b on the side 78 of the card edge 32 to electrically connect the mating segments 40b to the ground contact pads 46b, and thereby the ground plane 88. Optionally, the edge surface 80 of the PCB 34 abuts a shoulder 100 of the housing 16 when the electronic module 14 is mated with the connector 10.

As can be seen in FIG. 6, the ground plane 88 of the PCB 34 extends between the mating segments 40b of the ground contact 38b when the card edge 32 is received within the card slot 30. Accordingly, when the electronic module 14 is mated with the connector 10, the ground plane 88 extends between the opposing rows 56 and 58 of the mating segments 40 of the electrical contacts 38. For example, the ground plane 88 intersects a straight line 102 drawn from a mating segment 40 within the row 56 to a mating segment 40 within the row 58. Along the width W of the card slot 30, the ground plane 88 extends between the differential signal pairs 38A that are arranged within the row 56 and the differential signal pairs 38A that are arranged within the row 58. The ground plane 88 thus electrically isolates the differential signal pairs 38A within the row 56 from the differential signal pairs 38A within the row 58. As can be seen in FIG. 6, the bases 92 of the ground contacts 38b extend across the width W of the card slot 30 from the side 52 (FIG. 2) to the side 54 (FIG. 2). The bases 92 act as continuations of the ground plane 88 that continue the ground plane 88 in the direction of the arrow A in FIG. 6. The bases 92 and the mating segments 40b of the ground contacts 38b electrically isolate adjacent differential signal pairs 38A within the row 56 from each other and electrically isolate adjacent differential signal pairs 38A within the row 58 from each other. The impedance of the connector 10 can be tuned to facilitate achieving a predetermined impedance by selecting the pitch between adjacent signal contacts 38a and/or between adjacent differential signal pairs 38A, by selecting the number and/or spacing of the ground contacts 38b relative to each other and/or signal contacts 38a, by selecting the amount of air and/or dielectric materials of the housing 16 that extend between signal contacts 38a and/or between a signal contact 38a and a ground contact 38b, and/or the like.

Figure 7:
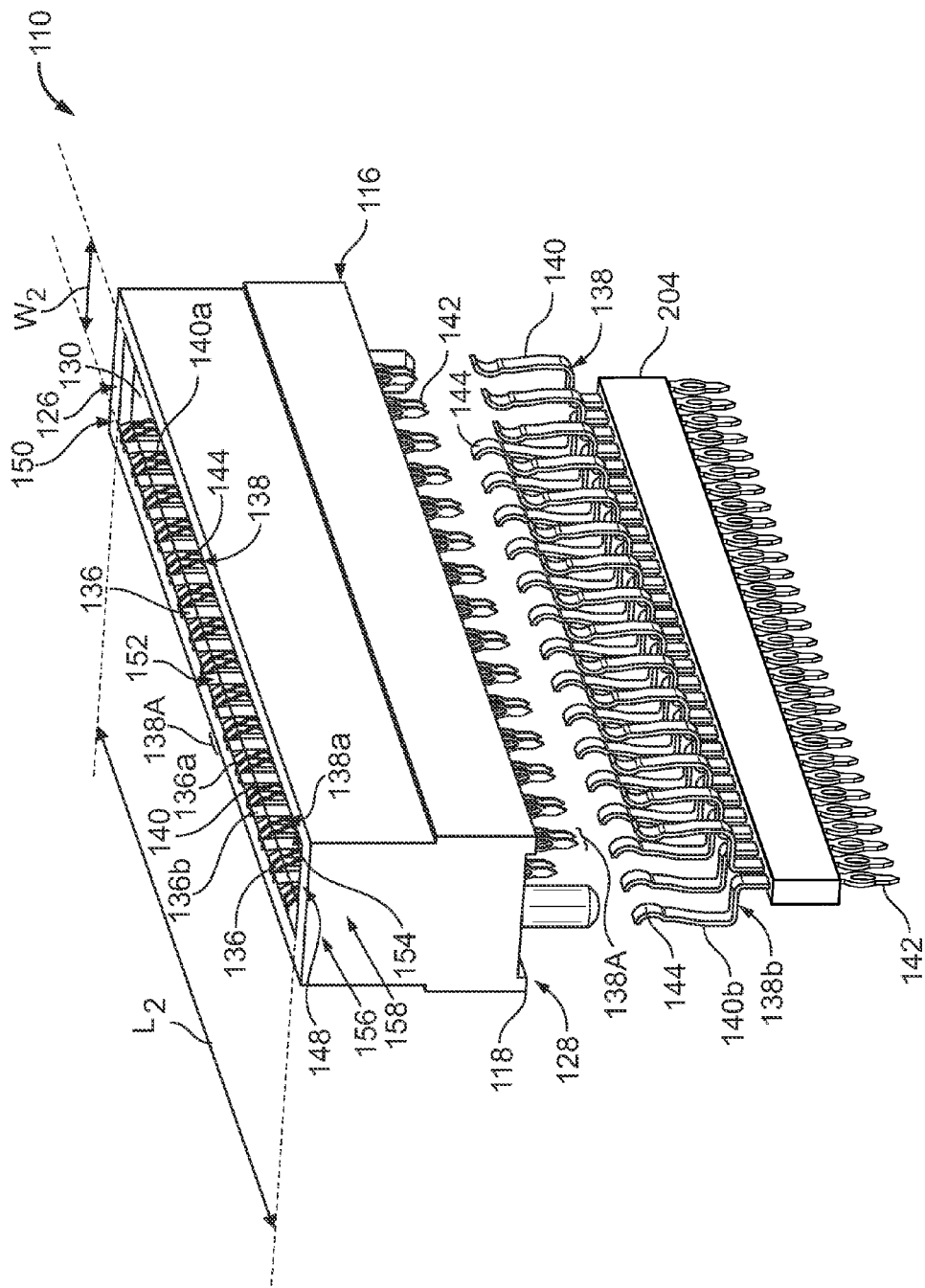
FIG. 7 is a partially exploded perspective view of an exemplary alternative embodiment of a card edge connector.

FIG. 7 is a partially exploded perspective view of an exemplary alternative embodiment of a card edge connector 110. The connector 110 includes a housing 116 having a dielectric body 118. The housing 116 includes a mating side 126 and a mounting side 128. The body 118 includes a card slot 130 that is configured to receive a card edge 132 (FIG. 9) of an electronic module 114 (FIG. 9) therein. The housing body 118 includes a plurality of openings 136 that hold electrical contacts 138 therein. The electrical contacts 138 include mating segments 140 and mounting segments 142. The connector 110 may include any number of the electrical contacts 138. A combination of the connector 110 and the electronic module 114 may be referred to herein as an "electrical connector assembly".

The card slot 130 extends a length $L_2$ from an end 148 to an opposite end 150. The card slot 130 extends a width $W_2$ from a side 152 to an opposite side 154. The card slot 130 is elongate. The mating segments 140 of the electrical contacts 138 are arranged in a pair of opposing rows 156 and 158 that extend along the sides 152 and 154, respectively, of the card slot 130. Mating interfaces 144 of the electrical contacts 138 within the row 156 face generally towards, or oppose, the mating interfaces 144 of the electrical contacts 138 within the opposing row 158, and vice versa. The length $L_2$ of the card slot 130 may be referred to herein as a "slot length". Each of the sides 152 and 154 of the card slot 130 may be referred to herein as a "first side" and/or a "second side". The rows 156 and 158 may each be referred to herein as a "first row" and/or a "second row".

The electrical contacts 138 include signal contacts 138a and ground contacts 138b. Mating segments 140a of the signal contacts 138a are held within signal openings 136a of the housing openings 136. Mating segments 140b of the ground contacts 138b are held within ground openings 136b of the housing openings 136. The electrical contacts 138 optionally include one or more power contacts that are configured to carry electrical power. The signal contacts 138a are arranged in differential signal pairs 138A. In the exemplary embodiment, the mating segments 140a of adjacent signal contacts 138a within the row 156 are arranged in differential signal pairs 138A, and the mating segments 140a of adjacent signal contacts 138a within the row 158 are arranged in differential signal pairs 138A. In some alternative embodiments, one or more of the signal contacts 138a is not arranged in a differential signal pair. Moreover, in some alternative embodiments, the mating segment 140a of a signal contact 138a within the row 156 is arranged in a differential signal pair with the mating segment 140a of a signal contact 138a within the row 158. In the exemplary embodiment, the mating segments 140a of differential pairs 138A within the rows 156 and 158 are staggered relative to each other along the length of the housing body 118. Alternatively, the mating segments 140a of differential pairs 138A within the row 156 are transversely aligned with the mating segments 140a of corresponding differential pairs 138A within the row 158 along the length of the housing body 118.

The mating segments 140b of the ground contacts 138b are arranged within the rows 156 and 158 between adjacent differential signal pairs 138A. In the exemplary embodiment, a single mating segment 140b of the ground contacts 138b extends between each pair of adjacent differential signal pairs 138A within each of the rows 156 and 158. But, any number of mating segments 140b of the ground contacts 138b may extend between adjacent differential signal pairs 138A. Each of the mating segments 140b of the ground contacts 138b may be referred to herein as a "ground mating segment".

The signal contacts 138a of the connector 110 are held directly by the housing body 118 in a manner that is similar to how the signal contacts 38a (FIGS. 1-4) are held directly by the housing 16 (FIGS. 1-6), for example as shown in FIG. 4. But, the ground contacts 138b are indirectly held by the housing body 118. Specifically, the ground contacts 138b are held by a dielectric insert 204 that is held by the housing body 118. The ground contacts 138b include bases 192 (FIG. 9) that are held by the insert 204. Optionally, the bases 192 of the ground contacts 138b are mechanically connected to adjacent ground contacts 138b via an electrically conductive segment (not shown), such that adjacent ground contacts 138b are electrically connected together. For example, in some embodiments the ground contacts 138b are stamped from a sheet of material and a carrier (not shown) that initially connects adjacent ground contacts 138b together after the stamping process is allowed to remain in place instead of being broken to separate adjacent ground contacts 138b. The electrical connection between adjacent ground contacts 138b provided by the electrically conductive segment electrically shorts the ground contacts 138b with each other. The housing 116 may be considered to include both the housing body 118 and the insert 204. The bases 192 may be referred to herein as "ground bases".

The insert 204 may be fabricated using any suitable process, method, and/or the like. Moreover, the ground contacts 138b may each be held by the insert 204 using any suitable manner, configuration, structure, means, method, process, and/or the like. In the exemplary embodiment, the insert 204 is molded over the bases 192 of the ground contacts 138b using any suitable molding process, method, and/or the like. In some alternative embodiments, the insert 204 is fabricated separately from the ground contacts 138b (using any suitable process, method, and/or the like) and the ground contacts 138b are thereafter inserted into cavities (not shown) provided within the insert 204.

Figure 8:
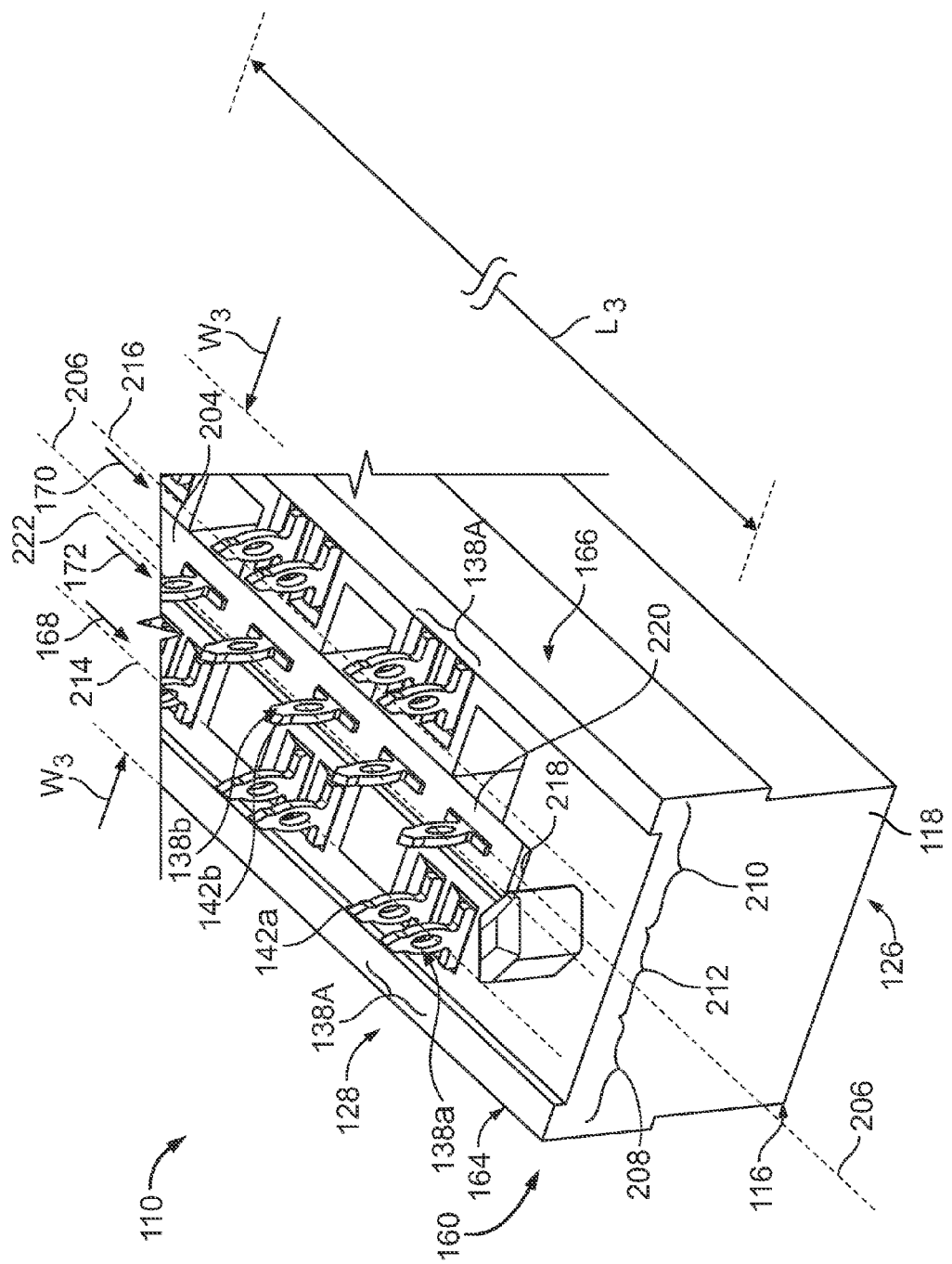
FIG. 8 is a perspective view of a portion of the card edge connector shown in FIG. 7.
Figure 9:
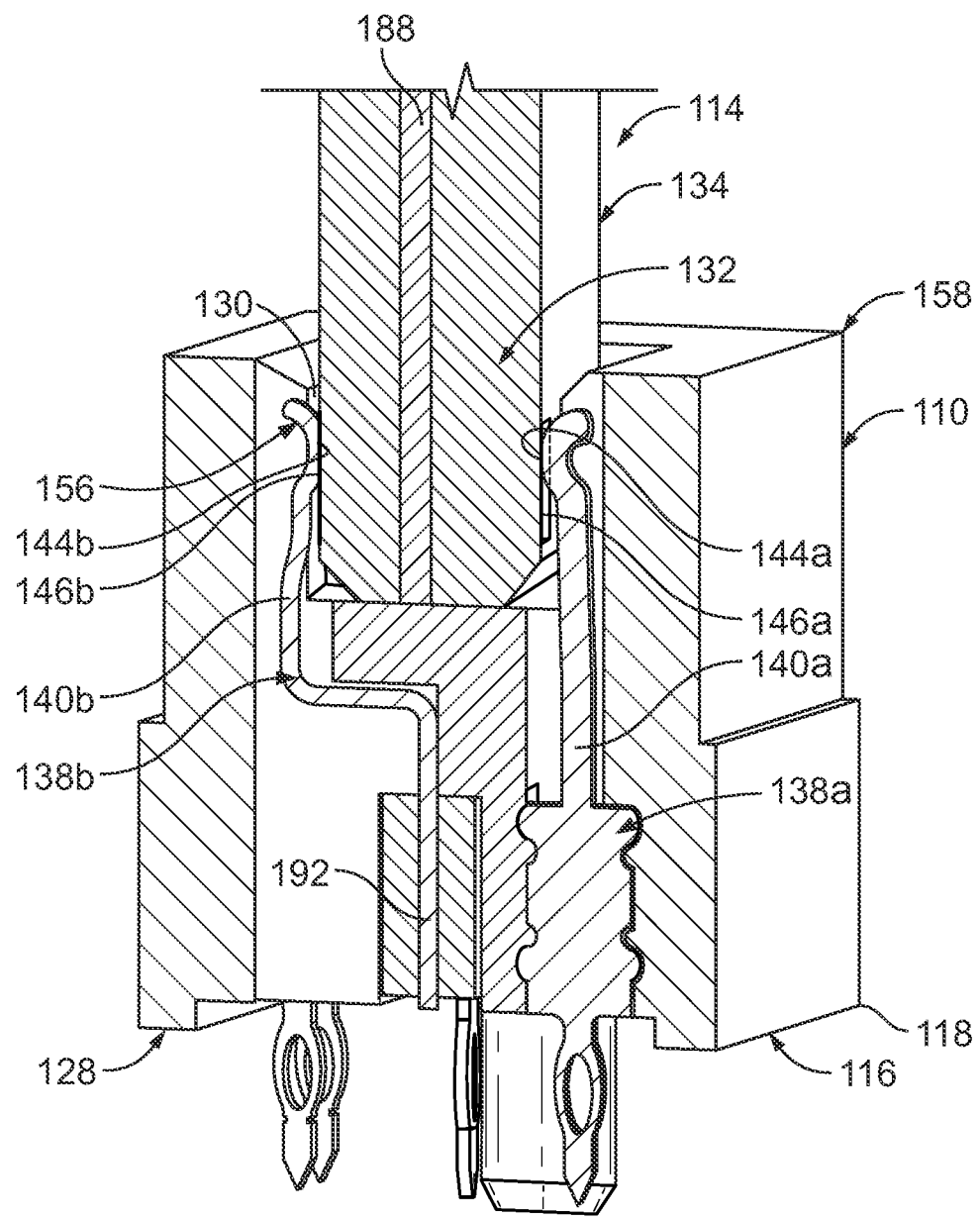
FIG. 9 is a cross-sectional view of the card edge connector shown in FIG. 7 illustrating an exemplary embodiment of an electronic module mated therewith.

FIG. 8 is a perspective view of a portion of the card edge connector 110 illustrating the mounting side 128 of the housing 116. The mounting side 128 extends a length $L_3$ along a central longitudinal axis 206 from an end 160 to an opposite end (not shown). Only a portion of the length $L_3$ of the mounting side 128 is shown in FIG. 8. The mounting side 128 extends a width $W_3$ from a side 164 to an opposite side 166. The length $L_3$ of the mounting side 128 extends in a direction that extends along the direction of the length $L_2$ (FIG. 7) of the card slot 130 (FIGS. 7 and 9). For example, in the exemplary embodiment the length $L_3$ of the mounting side 128 extends in a direction that is approximately parallel to the direction of the length $L_2$ of the card slot 130. The length $L_3$ of the mounting side 128 may be referred to herein as a "side length".

The mounting side 128 includes side segments 208 and 210 that extend along the length $L_3$ of the mounting side 128. A central segment 212 of the mounting side 128 extends between the side segments 208 and 210 along the length $L_3$ of the mounting side 128. In other words, the central segment 212 spaces apart and interconnects the sides segments 208 and 210 along the width $W_3$ of the mounting side 128. Each of the side segments 208 and 210 may be referred herein as a "first side segment" and/or a "second side segment".

Mounting segments 142a of the signal contacts 138a are arranged in a pair of rows 168 and 170 that extend along the length $L_3$ of the mounting side 128. The rows 168 and 170 extend along respective row axes 214 and 216. More particularly, the rows 168 and 170 extend in directions that are approximately parallel to the direction of the length $L_3$ of the mounting side 128. The rows 168 and 170 are spaced apart from each other along the width $W_3$ of the mounting side 128. For example, the row axes 214 and 216 of the rows 168 and 170, respectively, are spaced apart from each other along the width $W_3$ of the mounting side 128. As can be seen in FIG. 8, the row 168 extends along the side segment 208 of the mounting side 128, while the row 170 extends along the side segment 210. Optionally, the rows 168 and/or 170 extend approximately parallel to the length $L_2$ of the card slot 130. The rows 168 and 170 may each be referred to herein as a "first signal row" and/or a "second signal row". The row axes 214 and 216 may each be referred to herein as a "first signal row axis" and/or a "second signal row axis".

In the exemplary embodiment, the mounting segments 142a of adjacent signal contacts 138a within the row 168 are arranged in the differential signal pairs 138A, and the mounting segments 142a of adjacent signal contacts 138a within the row 170 are arranged in the differential signal pairs 138A. In some alternative embodiments, the mounting segment 142a of a signal contact 138a within the row 168 is arranged in a differential signal pair with the mounting segment 142a of a signal contact 138a within the row 170. In the exemplary embodiment, the mounting segments 142a of differential pairs 138A within the rows 168 and 170 are staggered relative to each other along the length $L_3$ of the mounting side 128. Alternatively, the mounting segments 142a of differential pairs 138A within the row 168 are transversely aligned with the mounting segments 142a of corresponding differential pairs 138A within the row 170 along the length $L_3$ of the mounting side 128.

The housing body 118 includes an opening 218 that extends between the rows 168 and 170 of the mounting segments 142a of the signal contacts 138a. The opening 218 fluidly communicates with the ground openings 136b (FIG. 7) that extend along the mating side 126 of the housing 116. The insert 204 is held within the opening 218 such that the mating segments 140b of the ground contacts 138b extend within corresponding ground openings 136b (FIG. 7). The insert 204 may be held within the opening 218 using any suitable structure, means, arrangement, and/or the like, such as, but not limited to, using an interference-fit arrangement, using a snap-fit arrangement, using a latch, and/or the like. As can be seen in FIG. 8, a surface 220 of the insert 204 defines a portion of the mounting side 128, and more particularly defines a portion of the central segment 212 of the mounting side 128.

When the insert 204 is held by the housing 116 as shown in FIG. 8, mounting segments 142b of the ground contacts 138b are arranged in a row 172 that extends along the length $L_3$ of the of the mounting side 128. More particularly, the row 172 extends in a direction that is approximately parallel to the direction of the length $L_3$ of the mounting side 128. The row 172 extends along a row axis 222. The row 172 extends between the rows 168 and 170 of the signal contact mounting segments 142a along the width $W_3$ of the mounting side 128. For example, as can be seen in FIG. 8, the row 172 extends along the central segment 212 of the mounting side 128. The row axis 222 of the row 172 is offset along the width $W_3$ of the mounting side 128 from each of the row axes 214 and 216 of the respective rows 168 and 172 such that the row axis 222 extends between the row axes 214 and 216 along the width $W_3$ of the mounting side 128. As shown in FIG. 8, the row axis 222 of the row 172 is optionally aligned with the central longitudinal axis 206 along the width $W_3$ of the mounting side 128. The row 172 of the ground contact mounting segments 142b optionally extends approximately parallel to the length $L_2$ of the card slot 130. Optionally, the mounting segments 142b of the ground contacts 138b are oriented approximately perpendicular to the mounting segments 142a of the signal contacts 138a. As can be seen in FIG. 8, no mounting segments 142b of the ground contacts 138b extend within the row 168 or the row 170 of signal contact mounting segments 142a, and vice versa.

The mounting segments 142b of the ground contacts 138b may be referred to herein as "ground mounting segments". The row 172 may be referred to herein as a "ground row", and the row axis 222 may be referred to herein as a "ground row axis". Each of the mating segments 140a of the signal contacts 138a may be referred to herein as a "signal mating segment". The signal contacts 138a having mating segments 140a arranged within the row 156 may be referred to herein as "first signal contacts" and/or "second signal contacts", while the signal contacts 138a having mating segments 140a arranged within the row 158 may be referred to herein as "first signal contacts" and/or "second signal contacts". The differential signal pairs 138A of the signal contacts 138a within the row 156 and the differential signal pairs 138A of the signal contacts 138a within the row 158 may each be referred to herein as "first differential signal pairs" and/or "second differential signal pairs". The mounting segments 142a arranged within the row 168 may be referred to herein as "first signal mounting segments" and/or "second signal mounting segments", while the mounting segments 142a arranged within the row 170 may be referred to herein as "first signal mounting segments" and/or "second signal mounting segments".

FIG. 9 is a cross-sectional view of the card edge connector 110 illustrating an exemplary embodiment of an electronic module 114 mated therewith. When the electronic module 114 is mated with the connector 110, a card edge 132 of a printed circuit board (PCB) 134 of the electronic module 114 is received within the card slot 130 of the connector 110. Mating interfaces 144b of the mating segments 140b of the ground contacts 138b are engaged with ground contact pads 146b the card edge 132 to electrically connect the ground contacts 138b to a ground plane 188 of the PCB 134. Mating interfaces 144a of the mating segments 140a of the signal contacts 138a are engaged with signal contact pads 146a on the card edge 132 to electrically connect the signal contacts 138a to the PCB 134.

As should be apparent from FIG. 9, when the electronic module 114 is mated with the connector 110, the ground plane 188 extends between the opposing rows 156 and 158 of the mating segments 140 of the electrical contacts 138. Along the width $W_2$ (FIG. 7) of the card slot 130 (FIGS. 7 and 9), the ground plane 188 extends between the differential signal pairs 138A (FIGS. 7 and 8) that are arranged within the row 156 and the differential signal pairs 138A that are arranged within the row 158. The ground plane 188 thus electrically isolates the differential signal pairs 138A within the row 156 from the differential signal pairs 138A within the row 158. The impedance of the connector 110 can be tuned to facilitate achieving a predetermined impedance by selecting the pitch between adjacent signal contacts 138a and/or between adjacent differential signal pairs 138A, by selecting the number and/or spacing of the ground contacts 138b relative to each other and/or signal contacts 138a, by selecting the amount of air and/or dielectric materials of the housing body 118 that extend between signal contacts 138a and/or between a signal contact 138a and a ground contact 138b, and/or the like.

Figure 10:
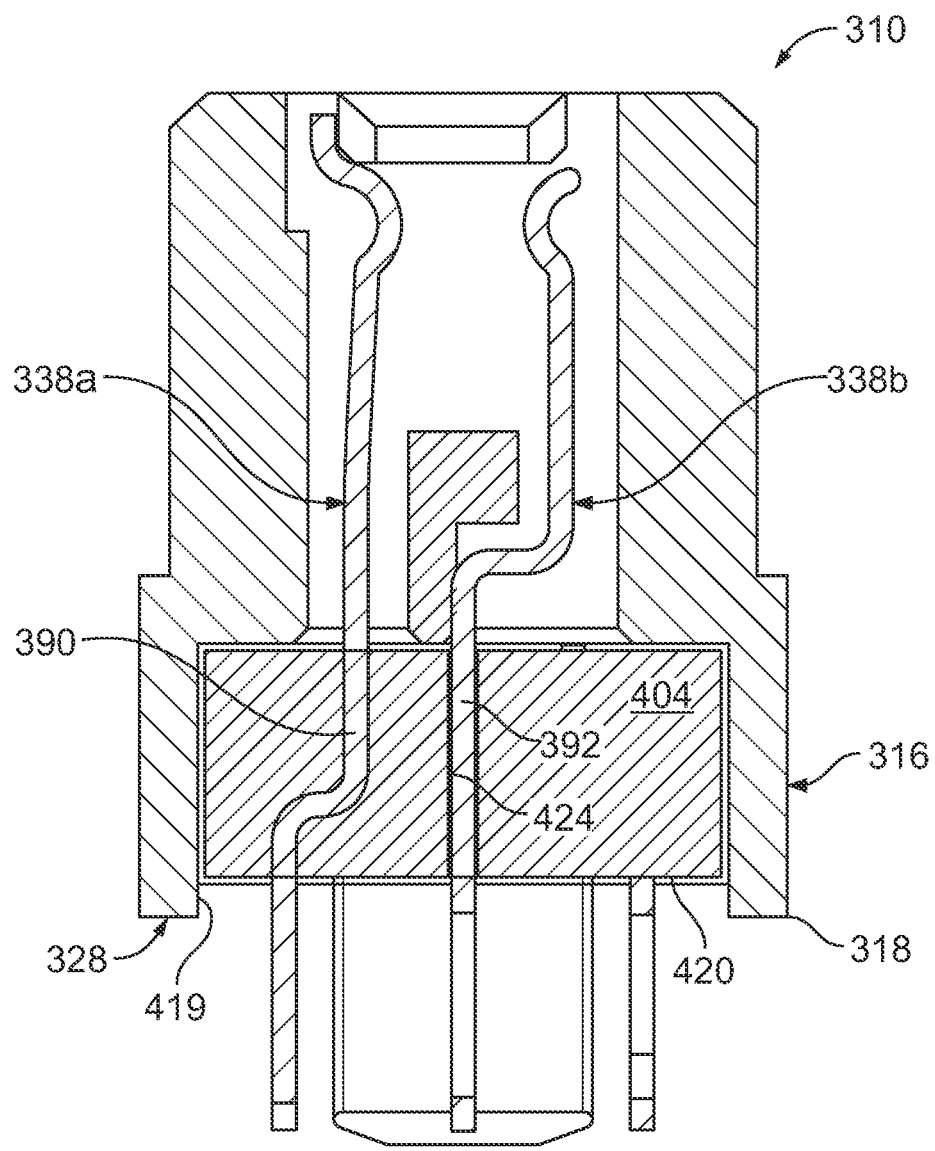
FIG. 10 is a cross-sectional view of another exemplary alternative embodiment of a card edge connector.

FIG. 10 is a cross-sectional view of another exemplary alternative embodiment of a card edge connector 310. The connector 310 includes a housing 316 having a dielectric body 318. The housing 316 includes a mounting side 328. The housing body 318 includes an opening 419 for receiving a dielectric insert 404 that holds signal contacts 338a and ground contacts 338b. Optionally, the connector 310 includes one or more power contacts that are configured to carry electrical power. The signal and ground contacts 338a and 338b, respectively, include respective bases 390 and 392. The connector 310 may include any number of signal contacts 338a, any number of ground contacts 338b, and any number of power contacts. The housing 316 may be considered to include both the housing body 318 and the insert 404.

Both the signal contacts 338a and the ground contacts 338b are indirectly held by the housing body 318. More particularly, the signal and ground contacts 338a and 338b, respectively, are held by the dielectric insert 404, which is held by the housing body 318 within the opening 419. The insert 404 may be held within the opening 419 using any suitable structure, means, arrangement, and/or the like, such as, but not limited to, using an interference-fit arrangement, using a snap-fit arrangement, using a latch, and/or the like. A surface 420 of the insert 404 defines a portion of the mounting side 328 of the housing 316.

The insert 404 may be fabricated using any suitable process, method, and/or the like. Moreover, the signal contacts 338a and the ground contacts 338b may each be held by the insert 404 using any suitable manner, configuration, structure, means, method, process, and/or the like. In the exemplary embodiment, the insert 404 is molded over the bases 390 of the signal contacts 338a (using any suitable molding process, method, and/or the like) and the bases 392 of the ground contacts 338b are inserted into one or more cavities 424 of the insert 404 after the insert 404 has been molded over the signal contacts 338a. The bases 392 of the ground contacts 338b may be held within the cavities 424 using any suitable structure, means, arrangement, and/or the like, such as, but not limited to, using an interference-fit arrangement, using a snap-fit arrangement, using a latch, and/or the like.

In some alternative embodiments, the insert 404 is molded over the bases 392 of the ground contacts 338b (using any suitable molding process, method, and/or the like) and the bases 390 of the signal contacts 338a are inserted into one or more cavities of the insert 404 after the insert 404 has been molded over the ground contacts 338b. In other alternative embodiments, the insert 404 is molded (using any suitable molding process, method, and/or the like) over both the signal and ground contacts 338a and 338b, respectively. In still other alternative embodiments, the bases 390 and 392 of the both the signal contacts 338a and the ground contacts 338b, respectively, are inserted into one or more cavities of the insert 404 after the insert 404 has been fabricated.

Optionally, the bases 392 of the ground contacts 338b are mechanically connected to the bases 392 of adjacent ground contacts 338b via an electrically conductive segment (not shown), such that adjacent ground contacts 338b are electrically connected together. The electrical connection between adjacent ground contacts 338b provided by the electrically conductive segment electrically shorts the ground contacts 338b with each other.

A combination of the connector 310 and an electronic module may be referred to herein as an "electrical connector assembly". Each of the signal contacts 338a may be referred to herein as a "first signal contact" and/or a "second signal contact". The bases 390 may be referred to herein as "signal bases", while the bases 392 may be referred to herein as "ground bases".

Figure 11:
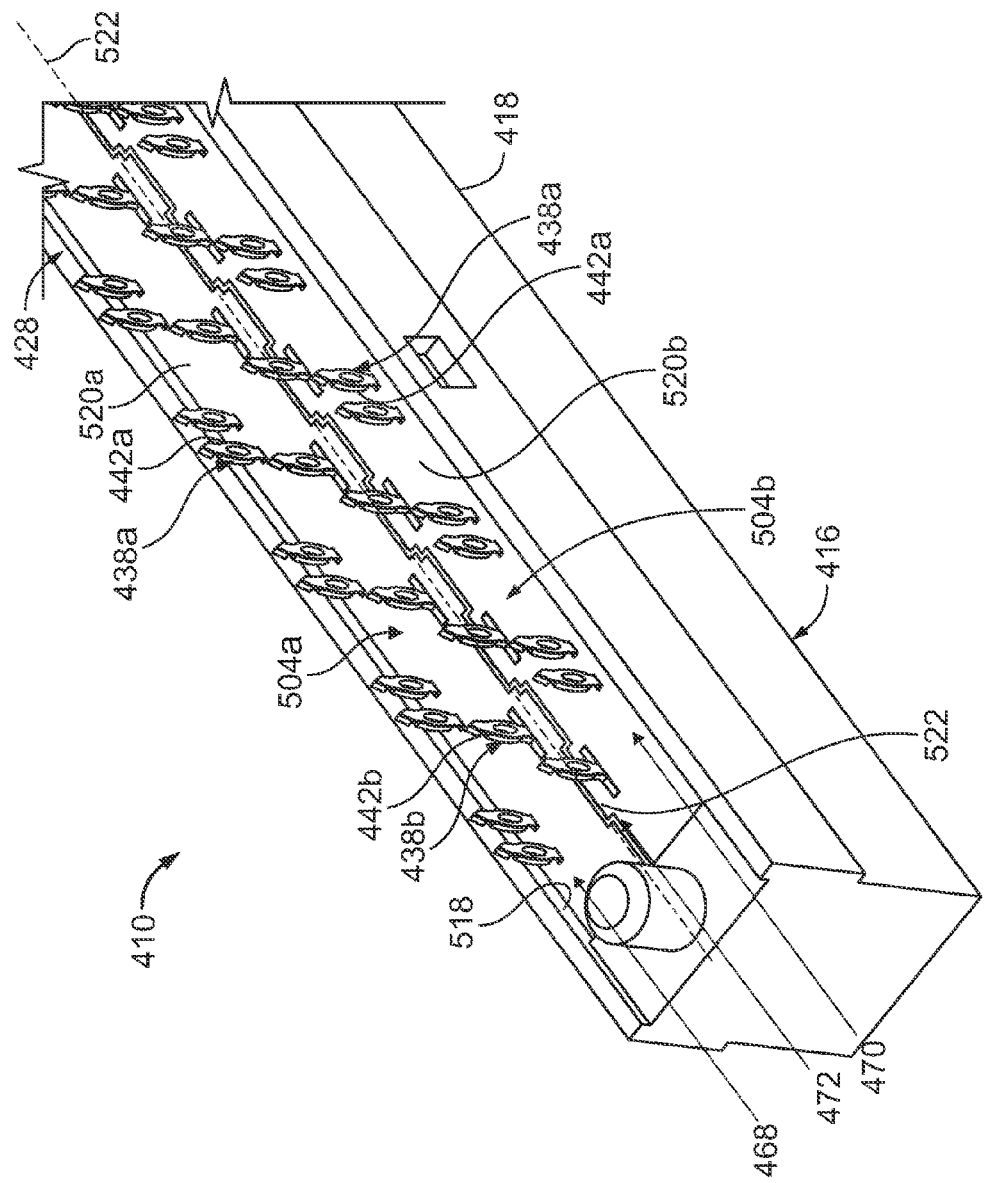
FIG. 11 is a perspective view of a portion of another exemplary alternative embodiment of a card edge connector.

FIG. 11 is a perspective view of a portion of yet another exemplary alternative embodiment of a card edge connector 410. The connector 410 includes a housing 416 having a dielectric body 418. The housing 416 includes a mounting side 428. The housing body 418 includes an opening 518 for receiving dielectric inserts 504a and 504b that each hold signal contacts 438a and ground contacts 438b. The inserts 504a and 504b may each be held within the opening 518 using any suitable structure, means, arrangement, and/or the like, such as, but not limited to, using an interference-fit arrangement, using a snap-fit arrangement, using a latch, and/or the like. Surfaces 520a and 520b of the inserts 504a and 504b, respectively, define a portion of the mounting side 428 of the housing 416. The housing 416 may be considered to include the housing body 418 and the inserts 504a and 504b. The connector 410 optionally includes one or more power contacts that are configured to carry electrical power. The connector 410 may include any number of signal contacts 438a, any number of ground contacts 438b, and any number of power contacts.

The signal and ground contacts 438a and 438b, respectively, include respective mounting segments 442a and 442b. The mounting segments 442a and 442b of the signal and ground contacts 438a and 438b, respectively, extend along the mounting side 428. The insert 504a holds a row 468 of the mounting segments 442a of the signal contacts 338a, and the insert 504b holds another row 470 of the mounting segments 442a of the signal contacts 338a. The mounting segments 442b of the ground contacts 338b are arranged in a row 472 that extends along a length of the mounting side 428. More particularly, the row 472 extends in a direction that is approximately parallel to the direction of the length of the mounting side 428. The row 472 extends along a row axis 522. As can be seen in FIG. 11, adjacent mounting segments 442b within the row 472 are staggered on respective opposite sides of the row axis 522. The insert 504a holds the mounting segments 442b that extend on one side of the row axis 522, while the insert 504b holds the mounting segments 442b that extend on the other side of the row axis 522. Optionally, the inserts 504a and 504b have a substantially similar geometry such that the inserts 504a and 504b are interchangeable with each other.

The inserts 504a and 504b may each be fabricated using any suitable process, method, and/or the like. Moreover, the signal contacts 438a and the ground contacts 438b may each be held by the inserts 504a and 504b using any suitable manner, configuration, structure, means, method, process, and/or the like. Optionally, the ground contacts 438b held by the insert 504a and/or the ground contacts held by the insert 504b are mechanically connected to adjacent ground contacts 438b of the same insert 504a or 504b via an electrically conductive segment (not shown). The electrical connection between ground contacts 438b provided by the electrically conductive segment electrically shorts the ground contacts 438b within each insert 504a and 504b to each other.

A combination of the connector 410 and an electronic module may be referred to herein as an "electrical connector assembly". Each of the signal contacts 438a may be referred to herein as a "first signal contact" and/or a "second signal contact". The mounting segments 442a of the signal contacts 438a may be referred to herein as "first signal mounting segments" and/or "second signal mounting segments". The rows 468 and 470 may each be referred to herein as a "first signal row" and/or a "second signal row". Each of the mounting segments 442b of the ground contacts 438b may be referred to herein as a "ground mounting segment". The row 472 may be referred to herein as a "ground row", while the row axis 522 may be referred to herein as a "ground row axis".

The embodiments described and/or illustrated herein may provide an electrical connector that has an improved impedance and/or efficiency of data transfer through the connector as compared to at least some known electrical connectors. The embodiments described and/or illustrated herein may provide an electrical connector having a reduced amount of crosstalk, interference, noise, and/or the like, and/or an improved signal performance, than at least some known electrical connectors.

It is to be understood that the above description and the figures are intended to be illustrative, and not restrictive. For example, the above-described and/or illustrated embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components (including the terms "upper", "lower", "vertical", and "lateral"), and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description and the figures. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
a printed circuit board (PCB) comprising a card edge and a ground plane that extends along the card edge; and a card edge connector comprising:
  a housing having a card slot, the card slot receiving the card edge of the PCB therein, the card slot comprising opposing first and second sides;
  signal contacts held by the housing, the signal contacts comprising signal mating segments arranged in opposing first and second rows that extend along the opposing first and second sides, respectively, of the card slot, wherein the card edge is received within the card slot such that the ground plane extends between the opposing first and second rows of the signal mating segments, and wherein the signal mating segments within the first row are arranged in differential signal pairs; and
  a ground contact held by the housing, the ground contact comprising a ground mating segment that is arranged within the first row of the signal mating segments such that the ground mating segment extends between adjacent differential signal pairs within the first row.

2. The assembly of claim 1, wherein the ground plane of the PCB intersects a straight line drawn from one of the signal mating segments within the first row to one of the signal mating segments within the second row.

3. The assembly of claim 1, wherein the card edge comprises an end surface, the ground plane extending proximate the end surface.

4. The assembly of claim 1, wherein the card edge comprises an end surface, the ground plane intersecting the end surface.

5. The assembly of claim 1, wherein the ground plane comprises an internal layer of the PCB.

6. The assembly of claim 1, wherein the ground contact is electrically connected to the ground plane.

7. The assembly of claim 1, wherein the ground mating segment is a first ground mating segment, the ground contact comprising a base, the first ground mating segment, and a second ground mating segment, the first and second ground mating segments extending outwardly from the base, the second ground mating segment being arranged within the second row of the signal mating segments, the first and second ground mating segments engaging the card edge therebetween to electrically connect the first and second ground mating segments to the ground plane.

8. The assembly of claim 1, wherein the first and second rows of the signal mating segments comprise first and second differential signal pairs, respectively, the card edge being received within the card slot such that the ground plane extends between the first and second differential signal pairs.

9. The assembly of claim 1, wherein the differential signal pairs of the signal mating segments within the first row are first differential signal pairs and the signal mating segments within the second row are arranged in second differential signal pairs, the first differential signal pairs being staggered relative to the second differential signal pairs along a length of the housing.

10. The assembly of claim 1, wherein the signal mating segments of the signal contacts within the second row are arranged in differential signal pairs, the signal mating segments within a differential signal pair being arranged within the same row of the first and second rows.

11. The assembly of claim 1, wherein the ground contact is a first ground contact and the ground mating segment is a first ground mating segment, the card edge connector further comprising a second ground contact held by the housing and having a second ground mating segment, the second ground mating segment being arranged within the first row of the signal mating segments, wherein the card edge is received within the card slot such that the ground plane overlaps the first and second ground mating segments and one of the signal mating segments that is arranged within the first row between the first and second ground mating segments.

12. The assembly of claim 1, wherein the card slot extends a depth into the housing along a depth axis, the ground mating segment comprising a ground mating interface that is aligned along the depth axis with signal mating interfaces of the signal mating segments of the signal contacts.

13. The assembly of claim 1, wherein the ground mating segment is configured to engage a contact pad that extends on a side of the PCB.

14. A card edge connector for mating with a printed circuit board (PCB) having a card edge and a ground plane that extends along the card edge, the connector comprising:
  a housing having a card slot, the card slot being configured to receive the card edge of the PCB therein, the card slot comprising opposing first and second sides;
  signal contacts held by the housing, the signal contacts comprising signal mating segments arranged in opposing first and second rows that extend along the opposing first and second sides, respectively, of the card slot, wherein the card slot is configured to receive the card edge therein such that the ground plane extends between the opposing first and second rows of the signal mating segments, and wherein the signal mating segments within the first row are arranged in differential signal pairs; and
  a ground contact held by the housing, the ground contact comprising a ground mating segment that is arranged within the first row of the signal mating segments such that the ground mating segment extends between adjacent differential signal pairs within the first row.

15. The connector of claim 14, wherein the ground mating segment is a first ground mating segment, the ground contact comprising a base, the first ground mating segment, and a second ground mating segment, the first and second ground mating segments extending outwardly from the base, the second ground mating segment being arranged within the second row of the signal mating segments, the first and second ground mating segments being configured to engage the card edge therebetween to electrically connect the first and second ground mating segments to the ground plane.

16. The connector of claim 14, wherein the card slot extends a depth into the housing along a depth axis, the ground mating segment comprising a ground mating interface that is aligned along the depth axis with signal mating interfaces of the signal mating segments of the signal contacts.

* * * * *